(12) United States Patent
Watanabe et al.

(10) Patent No.: US 6,602,618 B2
(45) Date of Patent: Aug. 5, 2003

(54) ORGANIC ELECTROLUMINESCENCE ELEMENT

(75) Inventors: Teruichi Watanabe, Tsurugashima (JP); Shin Kawami, Tsurugashima (JP); Takeo Wakimoto, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 31 days.

(21) Appl. No.: 09/822,826

(22) Filed: Apr. 2, 2001

(65) Prior Publication Data

US 2002/0015859 A1 Feb. 7, 2002

(30) Foreign Application Priority Data

Mar. 31, 2000 (JP) .......................................... 2000-097425

(51) Int. Cl.$^7$ ............................................... H05B 33/12
(52) U.S. Cl. ........................ 428/690; 428/917; 428/212; 313/504; 313/506
(58) Field of Search ................. 428/690, 917, 428/212; 313/504, 506; 257/102, 103

(56) References Cited

U.S. PATENT DOCUMENTS

2002/0037429 A1 * 3/2002 Sato et al. ................... 428/690

OTHER PUBLICATIONS

Teruichi Watanabe et al., "Optimization of driving lifetime durability in organic LED devices using Ir complex", Organic Light–Emitting Materials and Devices IV, Zakya H. Kafafi, Editor, Proceedings of SPIE vol. 4105, pp. 175–182 (2001), no month.*

Raymond C. Kwong et al., "High operational stability of electrophosphorescent devices", Applied Physics Letters 81(1), pp. 162–164 (Jul. 2002).*

C. W. Tang, "An Overview of Organic Electroluminescent Materials and Devices", SID 96 Digest, pp. 181–184 (1996), no month.*

M. A. Baldo et al., "Very high–efficiency green organic light–emitting devices based on electrophosphorescence", Applied Physics Letters 75(1), pp. 4–6 (Jul. 1999).*

Tetsuo Tsutsui et al., "High Quantum Efficiency in Organic Light–Emitting Devices with Iridium–Complex as a Triplet Emissive Center", Japanese Journal of Applied Physics, vol. 38, Pt. 2, No. 12B, pp. L1502–L1504 (Dec. 1999).*

* cited by examiner

Primary Examiner—Marie Yamnitzky
(74) Attorney, Agent, or Firm—Sughrue Mion, PLLC

(57) ABSTRACT

An organic electroluminescence element is comprised of a laminate of an anode, a light emitting layer made of an organic compound including phosphorescent materials, an electron transport layer made of an organic compound, and a cathode In the electroluminescence element, a hole blocking layer made of a specific aluminium chelate complex is laminated between the light emitting layer and the electron transport layer.

5 Claims, 4 Drawing Sheets

ORGANIC ELECTROLUMINESCENCE ELEMENT

BACKGROUND OF THE INVENTION

1. Technical Field

The present invention relates to an organic electroluminescence element (hereinafter also referred to as the "organic EL element") which utilizes the electroluminescence (hereinafter also referred to as the "EL") of organic compounds which emit light in response to a current injected thereinto, and has a light emitting layer formed of a laminate of such materials.

2. Description of the Related Art

Generally, each of the organic EL elements constituting a display panel using organic materials comprises an anode as a transparent electrode, a plurality of organic material layers including an organic light emitting layer, and a cathode comprised of a metal electrode, which are laminated as thin films in this order on a glass substrate as a display surface. The organic material layers include, in addition to the organic light emitting layer, a layer of a material having the hole transport capability such as a hole injection layer and a hole transport layer, a layer of a material having the electron transport capability such as an electron transport layer and an electron injection layer, and so on. Organic EL elements comprising these layers are also proposed. The electron injecting layer also contains an inorganic compound.

As an electric field is applied to the laminate organic EL element including an organic light emitting layer and an electron or hole transport layer, the holes are injected from the anode, while electrons are injected from the cathode. The electrons and the holes are recombined in the organic light emitting layer to form excitons. The organic EL element utilizes light which is emitted when the excitons return to a base state. In some cases, a pigment may be doped into the light emitting layer for improving the efficiency of light emission and stably driving the element.

Recently, it is suggested that phosphorescent materials are used for the light emitting layer of the organic EL element in addition to fluorescent materials. (D. F. O'Brien and M. A. Baldo et al "Improved energy transfer in electrophosphorescent devices" Applied Physics letters Vol. 74 No. 3, pp 442–444, Jan. 18, 1999; M. A. Baldo et al "Very high-efficiency green organic light-emitting devices based on electrophosphorescence" Applied Physics letters Vol. 75 No. 1, pp 4–6, Jul. 5, 1999; Tetsuo Tsutsui et al "High quantum efficiency in organic light-emitting devices with Iridium-complex as a triplet emissive center" JJAP Vol. 38 (1999) No. 12B in press, pp. L1502–L1504. Generally, luminescence is classified with a criterion in duration of afterglow after termination of the supplied energy into fluorescence at several nano seconds and phosphorescence at a comparative longer period e.g., micro seconds order. The discrimination of fluorescence and phosphorescence is not precise seriously. In phosphorescence, light emission duration is reduced in proportion to elevation of temperature. In fluorescence, light emission duration is not dependent on temperature i.e., afterglow is extremely rapid. In the recombination of electron and hole, electrons drop from an excited state level to the ground state level at which the organic molecule emits light. In this case, the excited organic molecule has the singlet excited state (electrons in inverse spin) of a high energy level and the excited triplet excited state (electrons in the same spin) of a high energy level.

In a study of the organic EL element, organic phosphorescent materials become a focus of attention as a substance to improve the light emission efficiency in recent years. Generally, the light emission process of phosphorescence involves the transition from the ground state to the exited state in the exited molecule, and then the intersystem crossing from the singlet exited state to triplet excited state occurs as a non-emissive transition.

The luminescence process from the triplet excited state to the ground state is usually called phosphorescence. The afterglow process from the triplet excited state through the singlet excited state to the ground state is called delayed fluorescence. The phosphorescence of the organic material is also different in spectrum from an ordinal fluorescence. The phenomenon shows that phosphorescence and fluorescence are different in the excited states (singlet state and triplet state) but the ground state is common. For example, anthracene exhibits phosphorescence of red 670–800 nm wavelengths and fluorescence of blue 470–480 nm wavelengths.

It is expected that a high light emission efficiency caused by the singlet and triplet excited states may be achieved in the utilization of the organic phosphorescence for the light emitting layer in the organic EL element. According to the quantum theory assumption, the ratio of production of singlet and triplet excited states is 1:3 because of difference of spin multiple in the recombination of electron and hole in the organic EL element, which leads that the EL element using phosphorescence may achieve an high light efficiency as three times of the device using fluorescence.

On the other hand, for improving the low power consumption nature, light emission efficiency, and driving stability of the organic EL element, it has been proposed to provide a hole blocking layer between the organic light emitting layer and the cathode for limiting the migration of holes from the organic light emitting layer. Efficient accumulation of holes in the light emitting layer with the aid of the hole blocking layer can result in an improved recombination probability with electrons, and a higher light emission efficiency. A report has been made that single use of a triphenyl diamine derivative or a triazole derivative is effective as a hole blocking material (see Japanese Unexamined Patent Publication Nos. Hei 8-109373 and Hei 10-233284).

While the provisions of an organic phosphorescent material light emitting layer and a hole blocking layer is effective for increasing the light emission efficiency of the organic EL element, a longer lifetime of the element is required. There is a need for a highly efficient organic electroluminescence element which continuously emits light at a high luminance with a less current.

OBJECT AND SUMMARY OF THE INVENTION

It is an object of the present invention to provide an organic EL element having effectiveness in prolonging life.

An organic electroluminescence element according to the present invention comprises: an anode, a light emitting layer made of an organic compound includes phosphorescent materials, an electron transport layer made of an organic compound and a cathode, which are layered in order, further comprising a hole blocking layer laminated between the light emitting layer and the electron transport layer and made of an aluminium chelate complex represented by the following general formula (1)

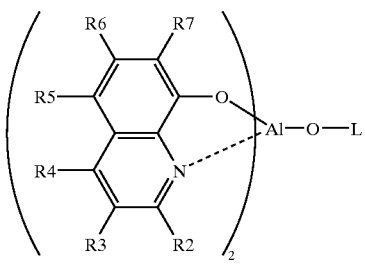

(1)

wherein
R2 denotes an alkyl, oxy, amino or hydrocarbon substituent having at least 1 carbon atom, carbon atom being 1 to 10 in any one hydrocarbon moiety,
R3 to R7 independently denote a hydrogen atom, alkyl, oxy, amino or hydrocarbon substituent having at least 1 carbon atom, carbon atom being 1 to 10 in any one hydrocarbon moiety,
R5, R6 and R7 are selected from a group comprises of cyano, halogen, and α-haloalkyl, α-haloalkoxy, amido, sulfonyl, carbonyl, carbonyloxy and oxycarbonyl substituents containing up to 10 carbon atoms,
L denotes one of the following formulae (2)

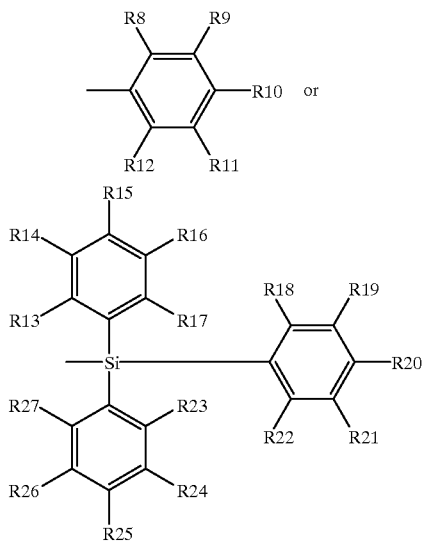

(2)

wherein R8 to R12 independently represent hydrogen or hydrocarbon groups of from 1 to 12 carbon atoms, with the proviso that R8 and R9 together or R9 and R10 together can form a fused benzo ring,
R13 to R27 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25.

In one aspect of the invention, the organic electroluminescence element further includes one or more layers made of a material having a hole transport capability, disposed between said anode and said light emitting layer, said material including an organic compound.

In another aspect of the invention, the organic electroluminescence element further includes one or more mixed layers made of plural kinds of materials having a hole transport capability, disposed between said anode and said light emitting layer, said material including an organic compound.

In a further aspect of the invention, the organic electroluminescence element further includes an electron injecting layer disposed between said cathode and said electron transport layer.

In a still further aspect of the organic electroluminescence element of the invention, said light emitting layer includes, as a main component, an electron transport material having a smaller ionization potential than that of said hole blocking layer.

DETAILED DESCRIPTION OF THE PREFERRED EMBODIMENTS

An embodiment of the present invention will hereinafter be described with reference to the accompanying drawings.

Figure 1:
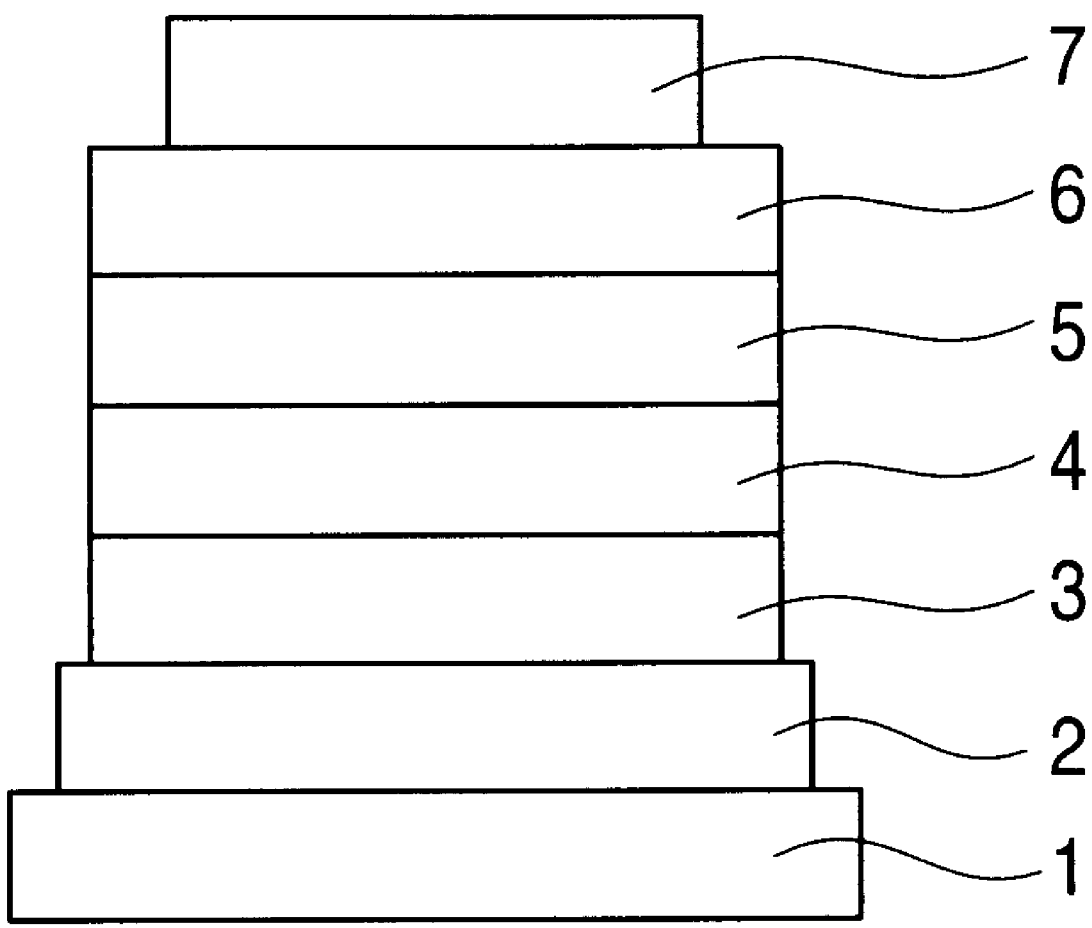
FIGS. 1 to 5 are diagrams schematically illustrating organic EL elements of embodiments according to the present invention.

An organic EL element according to the present invention comprises a transparent anode 2; a hole transport layer 3 made of an organic compound; a light emitting layer 4 made of an organic compound; a hole blocking layer 5 made of an organic compound; an electron transport layer 6 made of an organic compound; and a cathode 7 made of a metal, which are laminated in this order on a transparent substrate 1 such as glass, as illustrated in FIG. 1.

Figure 2:
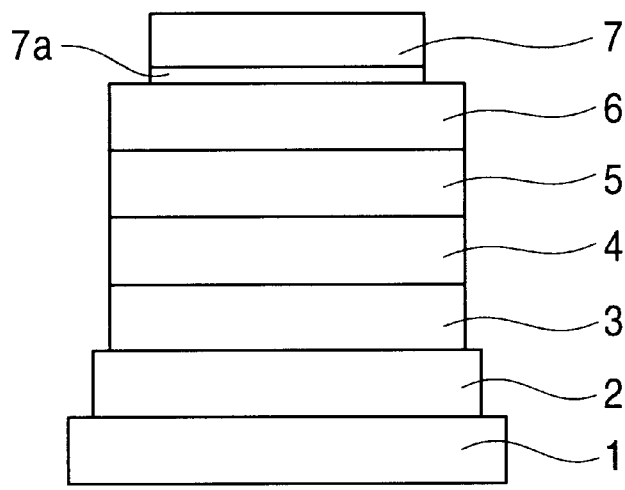

In addition to the foregoing structure, another organic EL element may have a structure which includes an electron injecting layer 7a laminated or deposited as a thin film between the electron transport layer 6 and the cathode 7, as illustrated in FIG. 2.

Figure 3:
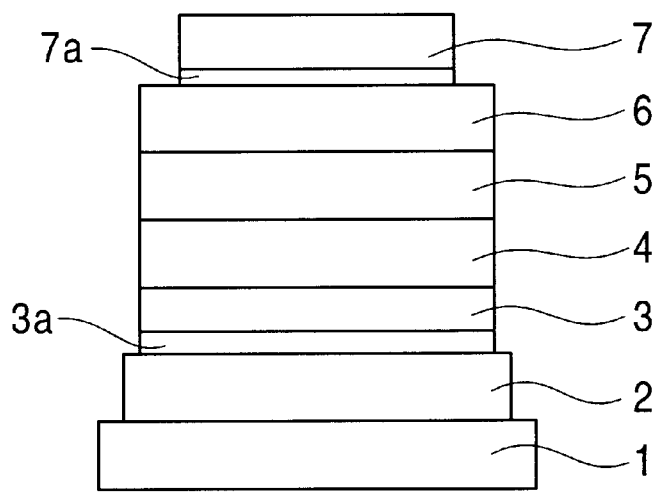

Further alternatively, as illustrated in FIG. 3, another organic EL element may include a hole injecting layer 3a laminated or deposited as a thin film between the anode 2 and the hole transport layer 3.

Figure 4:
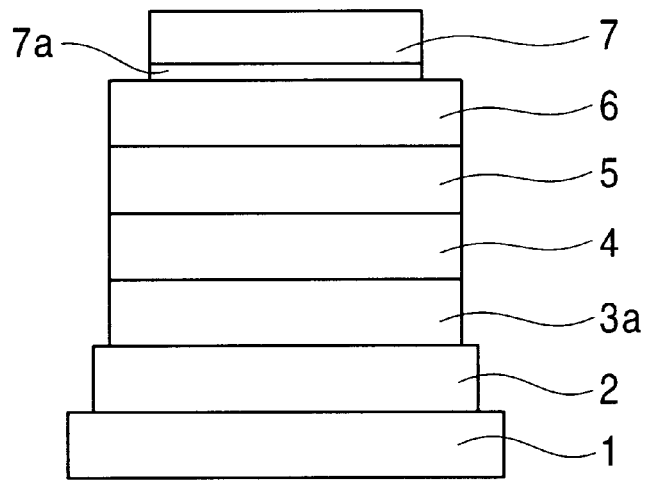
Figure 5:
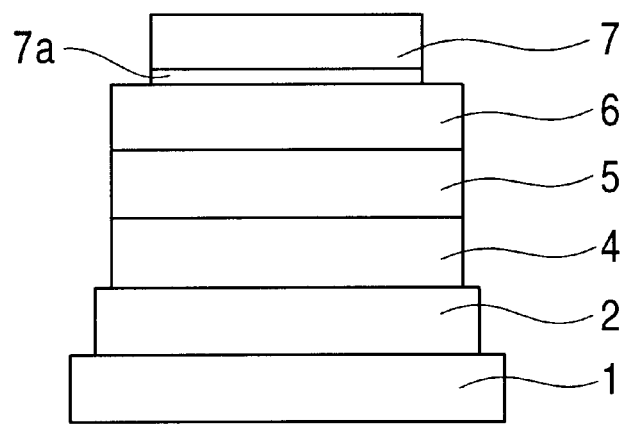

Also, the hole transport layer 3 or the hole injection layer 3a may be omitted from the structures illustrated in FIGS. 1 to 3, provided that the light emitting layer 4 is made of a light emitting material having the hole transport capability. For example, as illustrated in FIGS. 4 and 5, an organic EL element may have a structure comprised of an anode 2, a hole injecting layer 3a, a light emitting layer 4, a hole blocking layer 5, an electron transport layer 6 and a cathode 7 deposited in this order on a substrate 1, or a structure comprised of an anode 2, a light emitting layer 4, a hole blocking layer 5, an electron transport layer 6 and a cathode 7 deposited in this order.

As the cathode 1, there may be used a metal which has a small work function, for example, aluminum, magnesium, indium, silver, and alloys thereof, and a thickness in a range of approximately 100 to 5000 angstrom. Also, as the anode 2, there may be mentioned a conductive material which has a large work function, for example, indium tin oxide (hereinafter abbreviated as "ITO"), and a thickness in a range of approximately 300 to 3000 angstrom, or gold of approximately 800 to 1500 angstrom in thickness. It should be noted that when gold is used as an electrode material, the electrode is translucent. Either the cathode or the anode may be transparent or translucent.

In this embodiment, the hole blocking layer 5 laminated between the light emitting layer 4 and the electron transport layer 6 is a thin film made of an aluminium chelate complex represented by the following general formula (1).

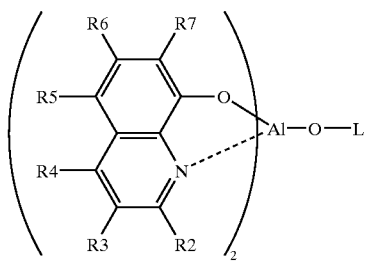

(1)

wherein

R2 denotes an alkyl, oxy, amino or hydrocarbon substituent having at least 1 carbon atom falls within the preview of preferred substituents and preferably no more than 10 carbon atoms are present in any one hydrocarbon moiety and optimally no more than 6 carbon atoms. That is, R2 preferably takes the form of —R', —OR' or —N(R")R', where R' is a hydrocarbon of from 1 to 10 carbon atoms, and R" is R' or hydrogen. R3 through R7 independently denote a hydrogen atom, alkyl, oxy, amino or hydrocarbon substituent having at least 1 carbon atom falls within the preview of preferred substituents and preferably no more than 10 carbon atoms are present in any one hydrocarbon moiety and optimally no more than 6 carbon atoms. In addition, R5, R6, and R7 can be selected from a group comprises of cyano, halogen, and α-haloalkyl, α-haloalkoxy, amido, sulfonyl, carbonyl, carbonyloxy and oxycarbonyl substituents containing up to 10 carbon atoms, most preferably 6 or fewer carbon atoms. In the case that R3, R4, R5, R6 and R7 are hydrogen atoms and R2 is any one of the substituents, then a sufficient steric blocking is obtained for the aluminium chelate complex.

Symbol L of the phenolato ligand O-L denotes one of the following formulae (2)

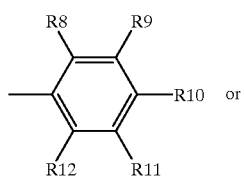

(2)

or

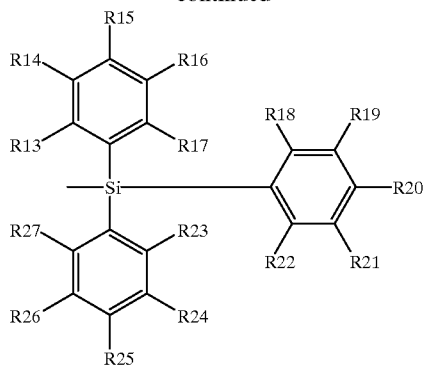

The preferred ligands for the aluminum chelates are derived from HO-L phenols, where L is a hydrocarbon of from 6 to 24 carbon atoms comprised of a phenyl moiety, or, from triphenyl Si or triphenyl silane. R8 to R12 and R13 to R27 in both the ligands collectively contain 12 or fewer carbon atoms and each independently represent hydrogen or hydrocarbon groups of from 1 to 12 carbon atoms, with the proviso that R8 and R9 together or R9 and R10 together can form a fused benzo ring. In addition, R13 and R14 or R14 and R15 can form a fused benzo ring, R18 and R19 or R19 and R20 can form a fused benzo ring, and R23 and R24 or R24 and R25 can form a fused benzo ring. The phenols includes not only hydroxybenzene, but a variety of hydrocarbon substituted hydroxybenzenes, hydroxynaphthalenes and other fused ring hydrocarbons. It is preferred that the phenolato ligand contain at least 7 carbon atoms. Aliphatic substituents of the phenyl moiety of phenolato ligand or substituted triphenyl Si are contemplated to contain from 1 to 12 carbon atoms each. Alkyl phenyl moiety substituents of from 1 to 3 carbon atoms are specifically preferred. Aromatic hydrocarbon substituents of the phenyl moiety are preferably phenyl or naphthyl rings. Phenyl, diphenyl and triphenyl substitution of the phenyl moiety are specifically preferred.

In the embodiment, the hole blocking layer 5 laminated between the light emitting layer 4 and the electron transport layer 6 is made of aluminium chelate complex represented by the formula below (3)

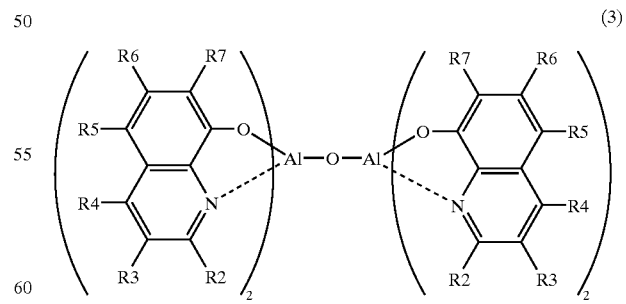

(3)

wherein R2 to R7 are the same as shown in the above formula (1) of aluminium chelate complex.

The hole blocking layer 5 of aluminium chelate complex is concretely selected from the substances denoted by the following formulae (4) to (39).

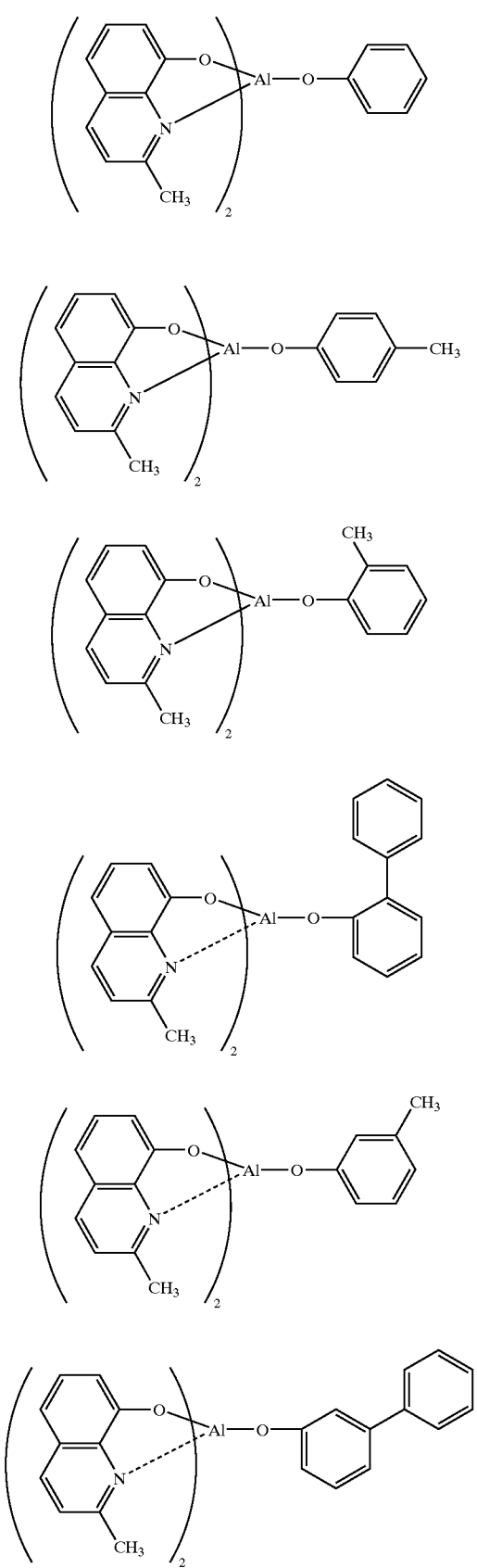
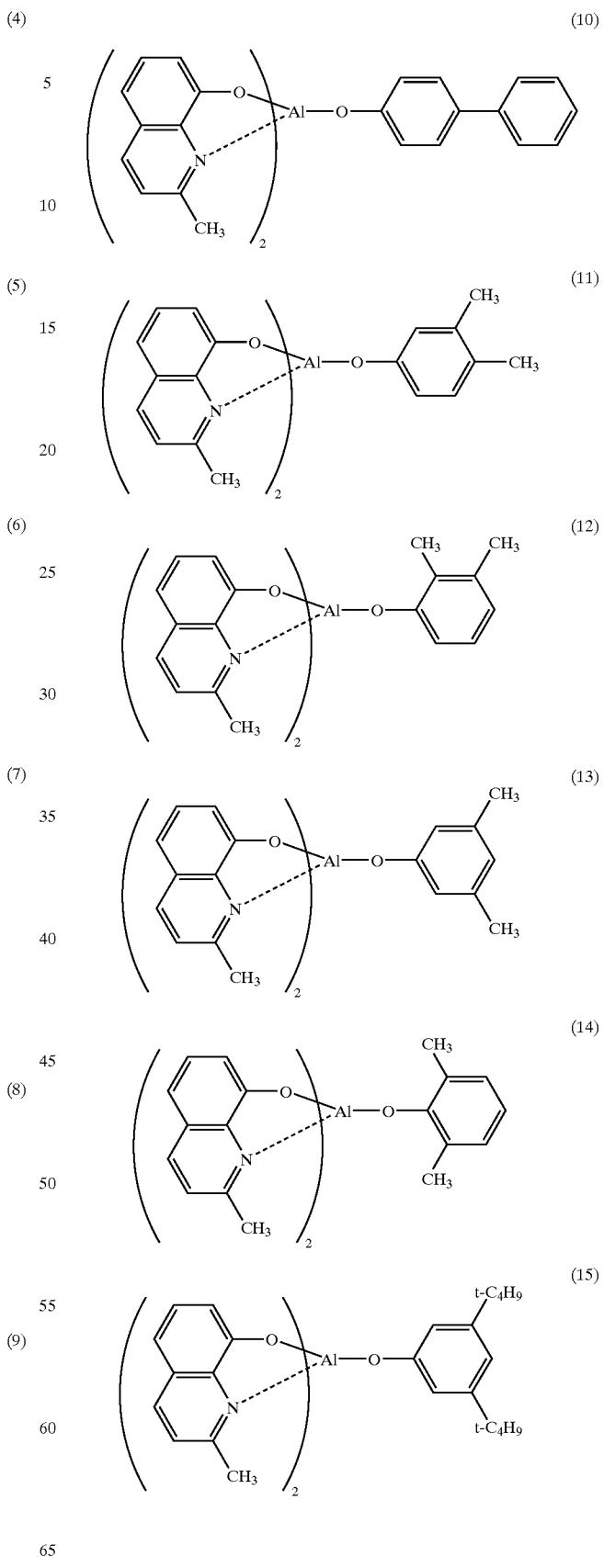

(16) 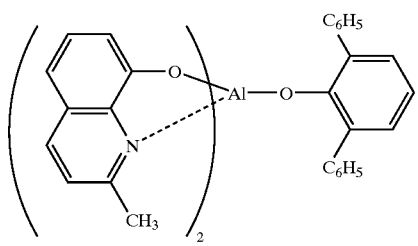
(17) 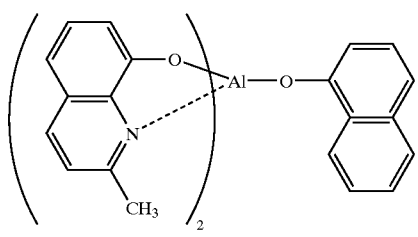
(18) 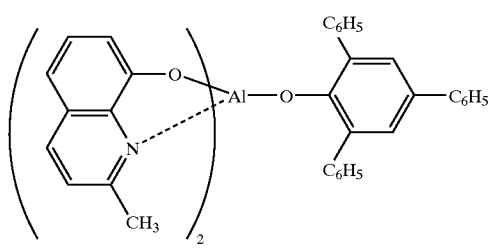
(19) 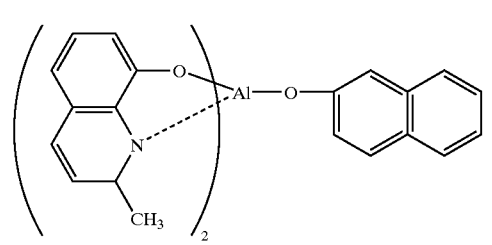
(20) 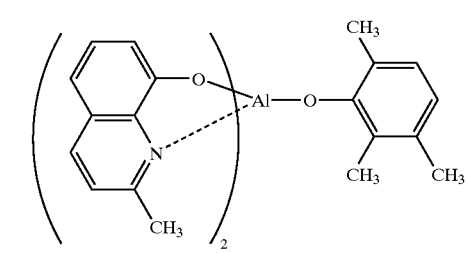
(21) 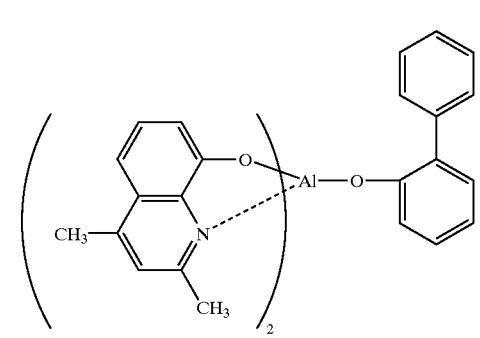
(22) 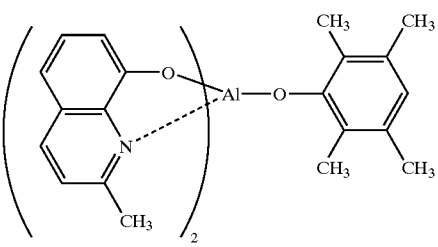
(23) 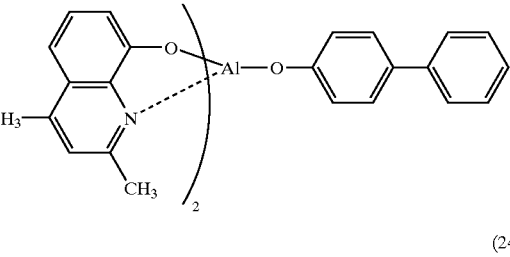
(24) 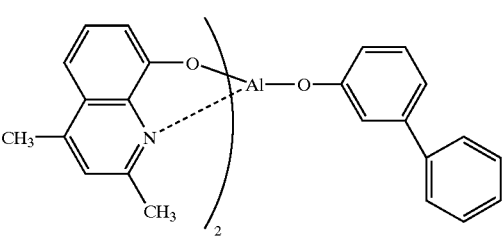
(25) 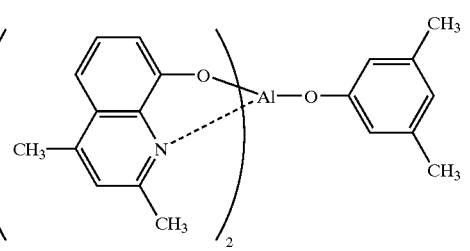
(26) 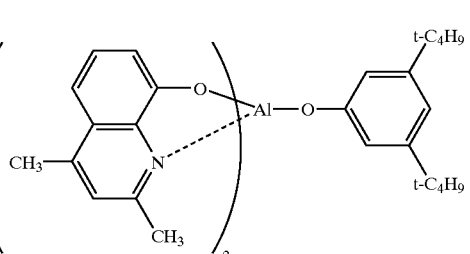
(27) 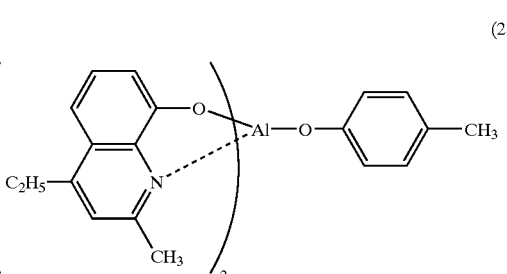

(28) 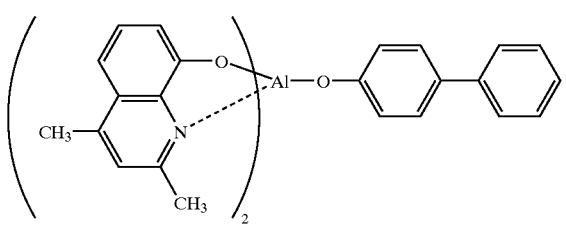
(29) 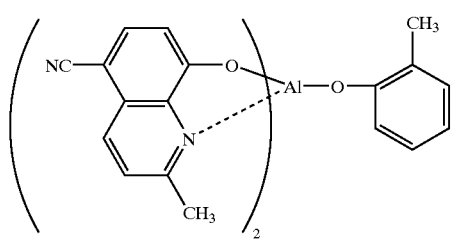
(30) 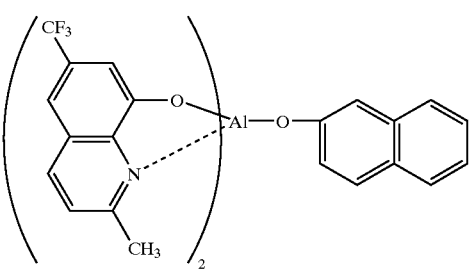
(31) 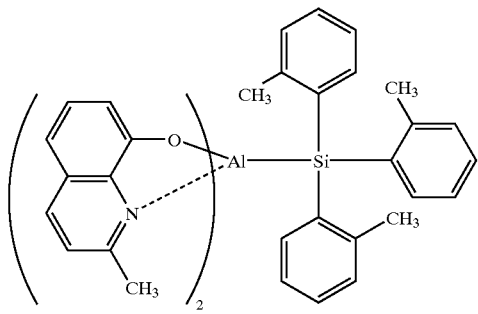
(32) 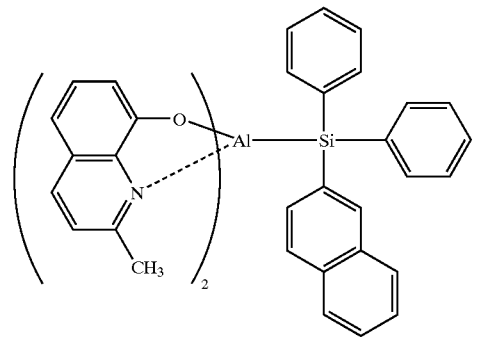
(33) 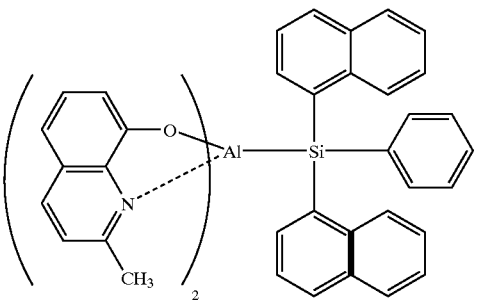
(34) 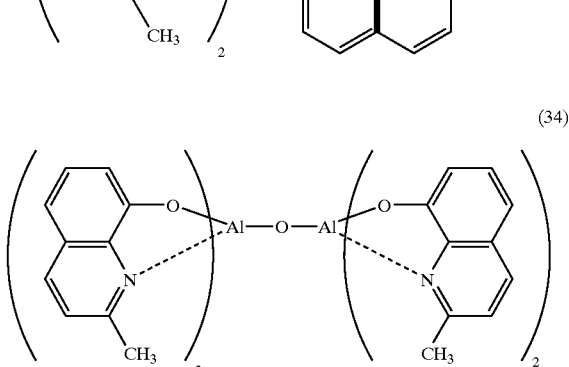
(35) 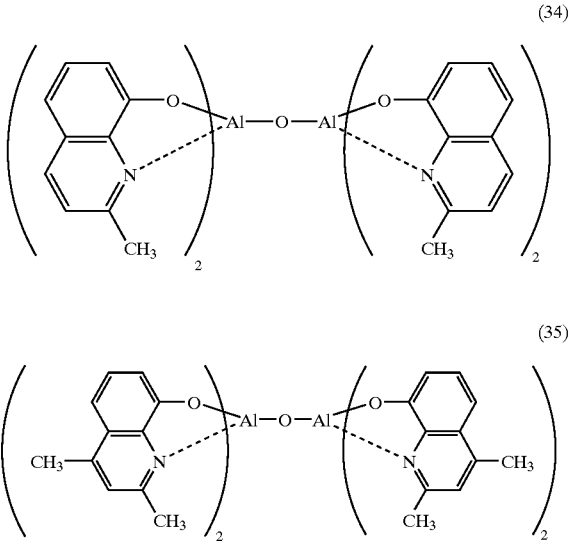
(36)
(37) 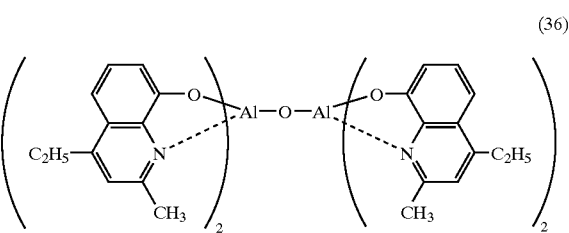
(38) 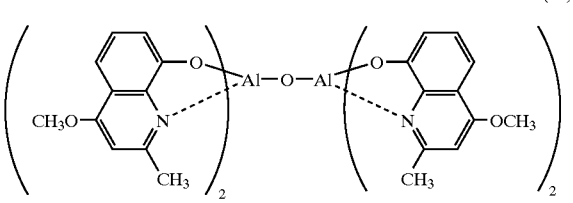
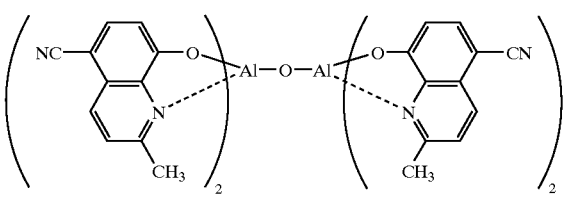

(39)
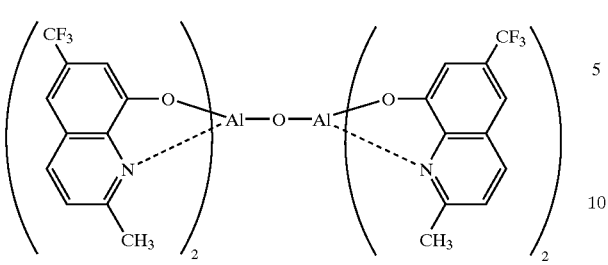

(40)
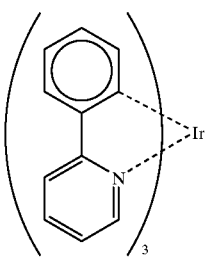

In the embodiment, the light emitting layer 4 contains organic phosphorescent materials such as 2,3,7,8,12,13,17, 18 -octaethyl-21H, 23H-porphine platinum (II), tris(2-phenylpyridine) iridium (hereinafter abbreviated as "Ir (PPY) 3") and the like. Ir(PPY)3 is represent by the following formula (40).

Electron transport materials having the electron transport capability usable for the electron transport 6 (also usable for the light emitting layer) may be selected from materials represented by the following chemical formulae (41) to (58). The light emitting layer includes at least one of electron transport materials having an ionization potential smaller than that of the hole blocking layer.

(41)
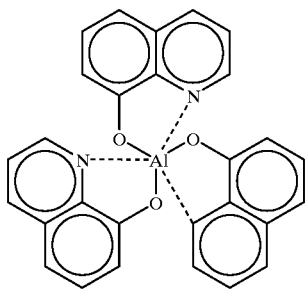

(42)
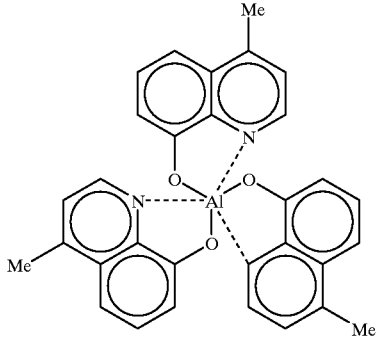

(43)
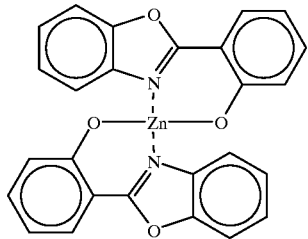

(44)
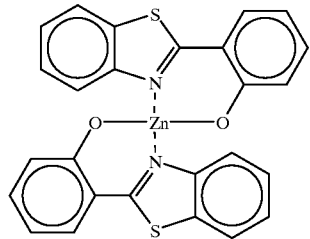

(45)
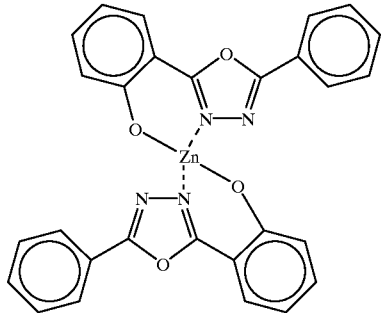

(46)
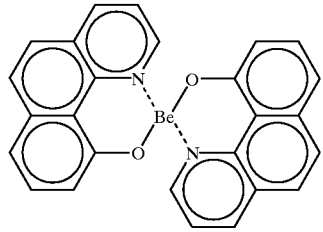

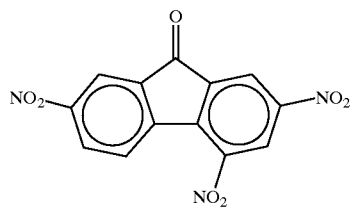
(47)
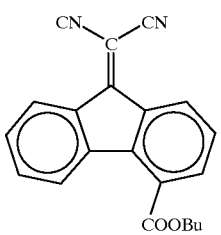
(48)
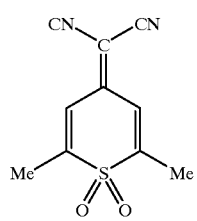
(49)
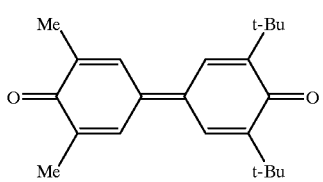
(50)
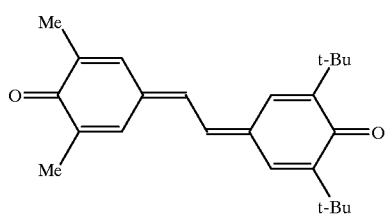
(51)
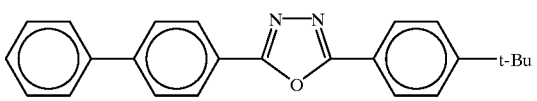
(53)
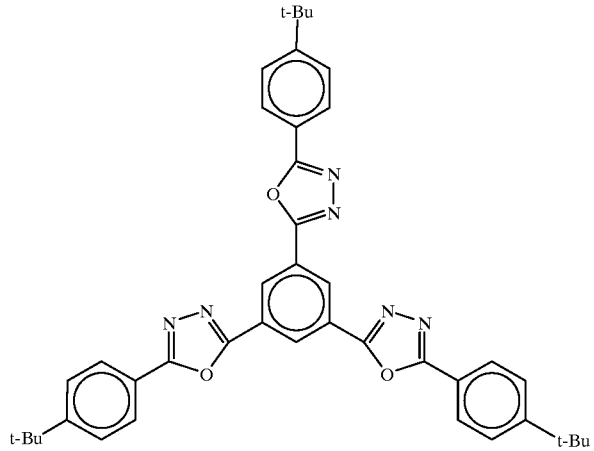
(52)
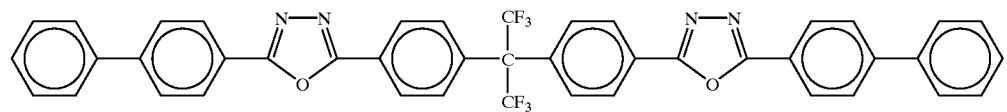
(54)

(55)
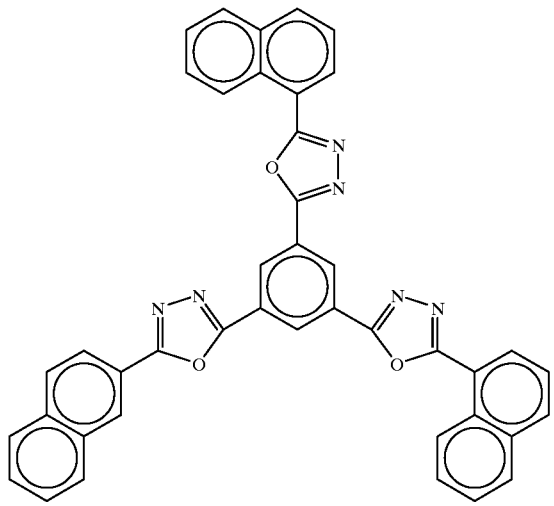
(56)
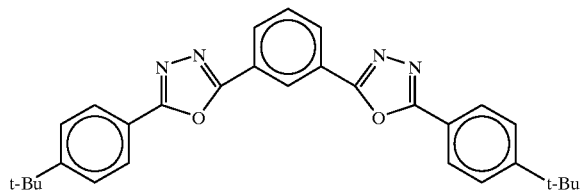
(57)
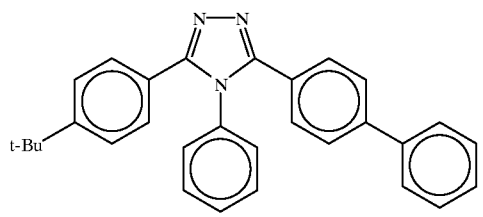
(58)
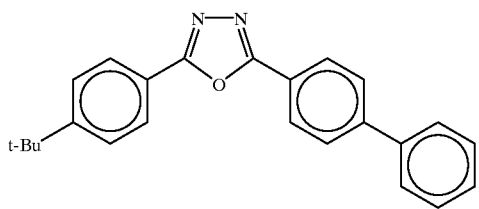
In this embodiment, host components contained in the hole transport layer 3 the light emitting layer 4 may be, for example, materials having the hole transport capability as represented by the following chemical formulae (59) to (84):
(59)
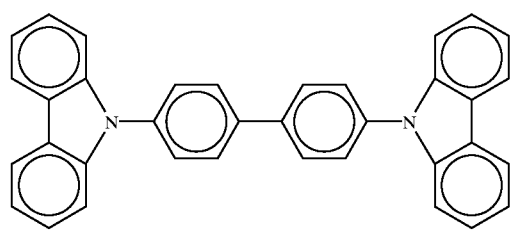
(60)
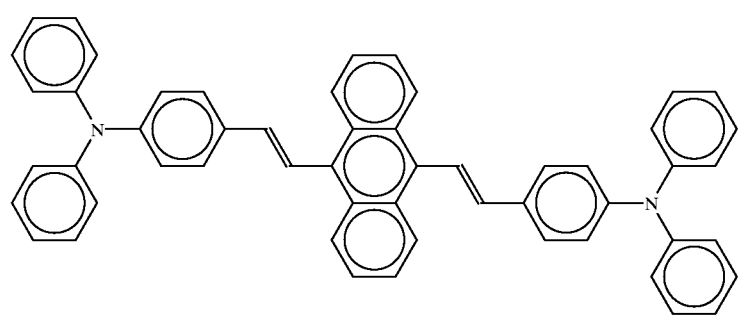

-continued
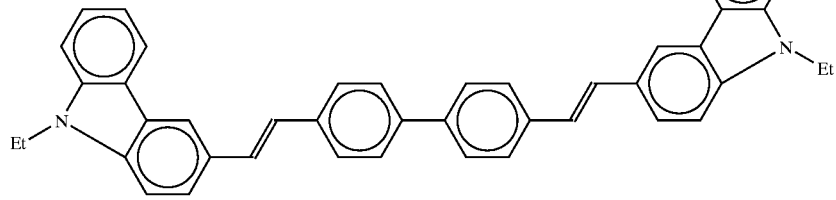
(61)
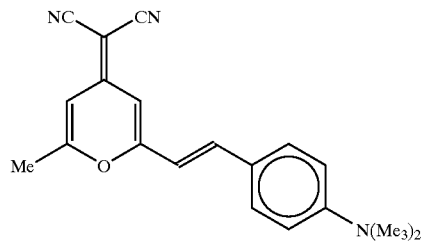
(62)
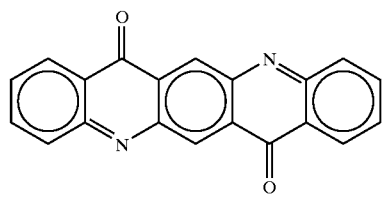
(63)
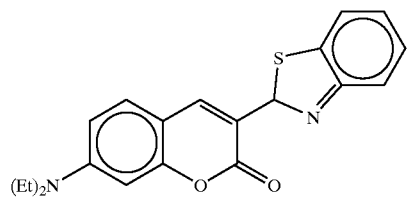
(64)
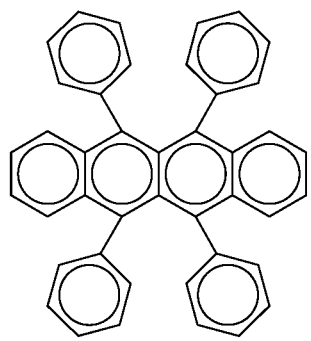
(65)
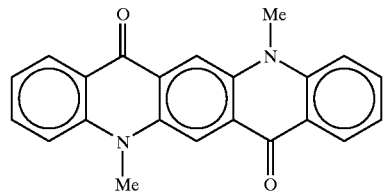
(66)
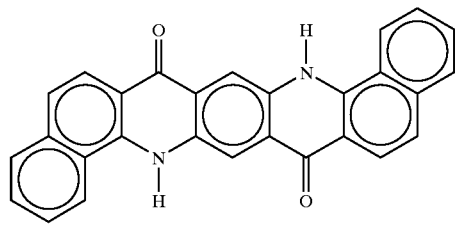
(67)
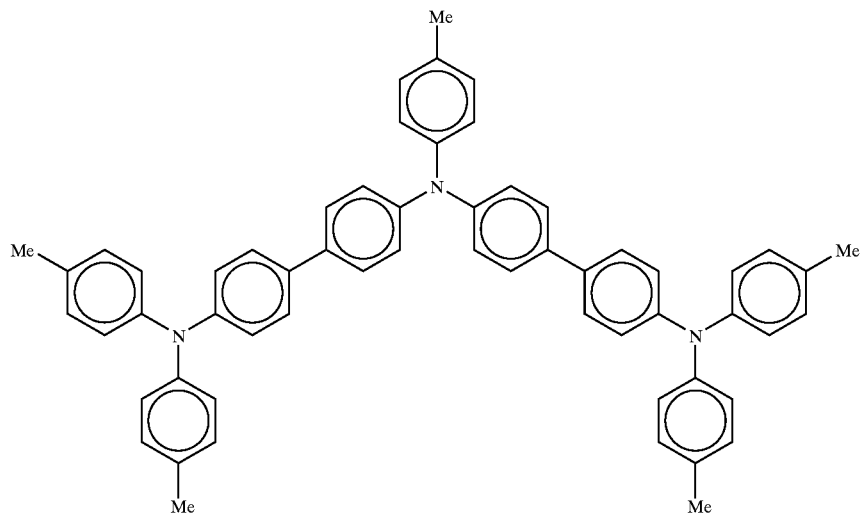
(68)

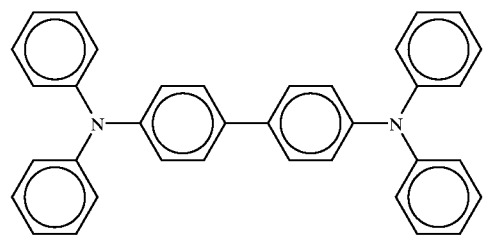
(69)
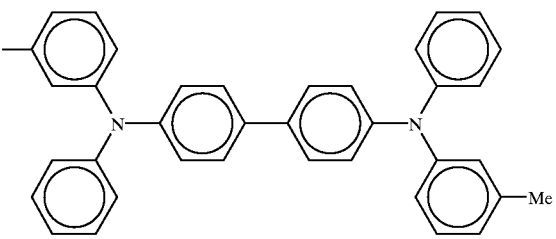
(70)
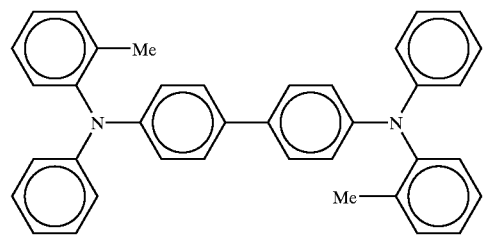
(71)
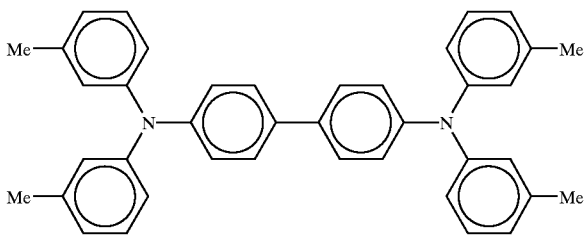
(72)
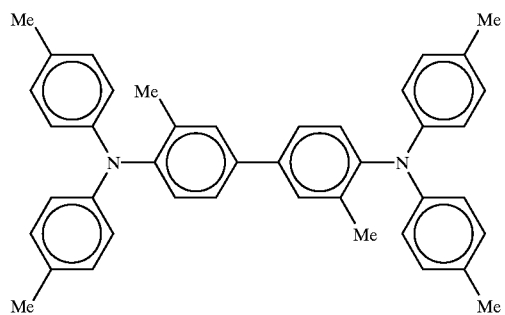
(73)
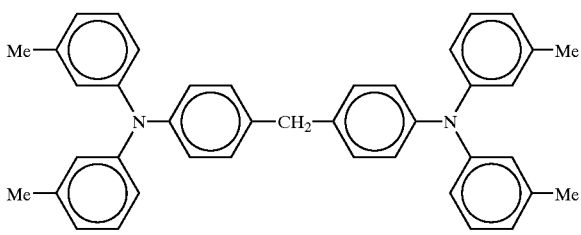
(74)
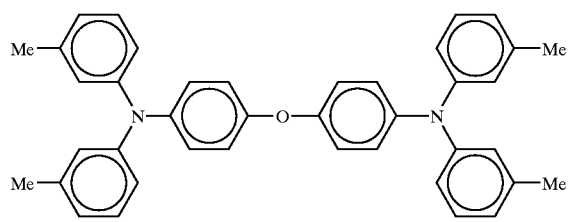
(75)
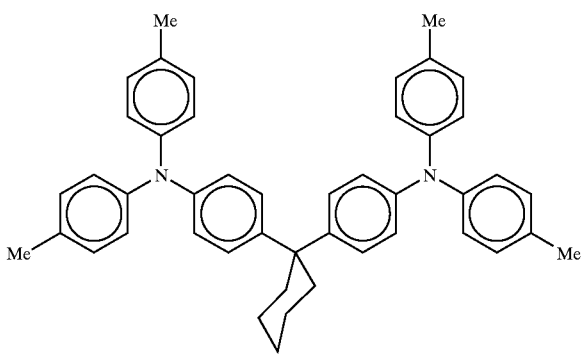
(76)
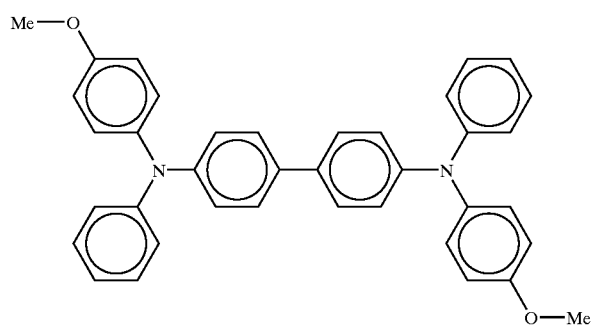
(77)
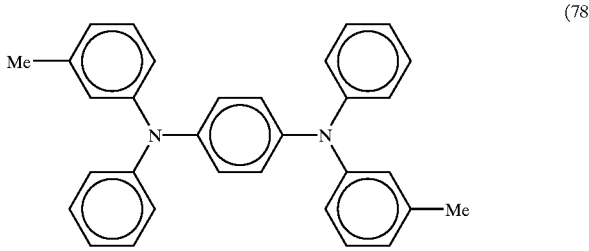
(78)

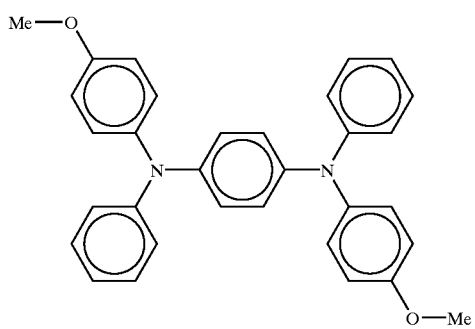

(79)

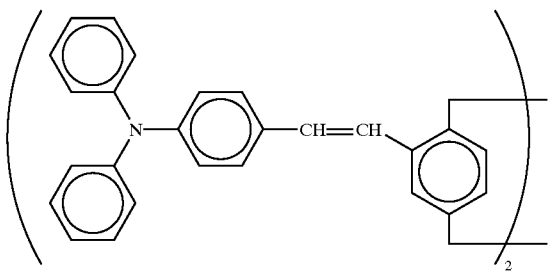

(80)

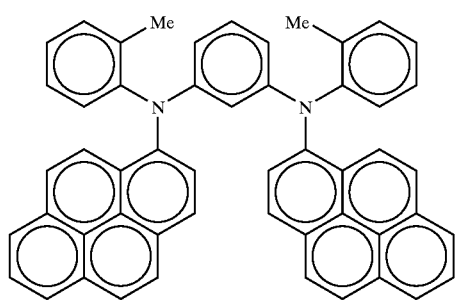

(81)

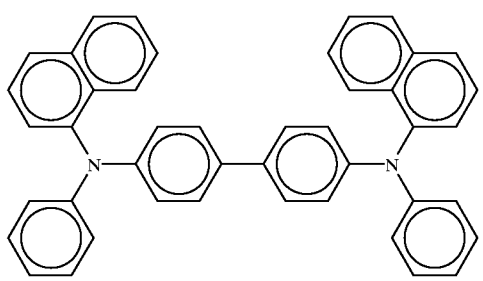

(82)

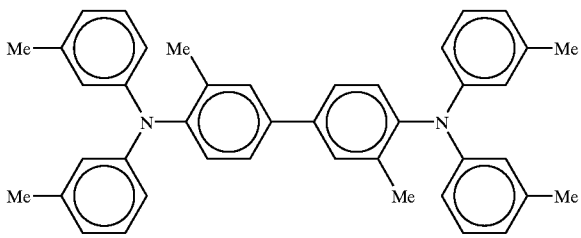

(84)

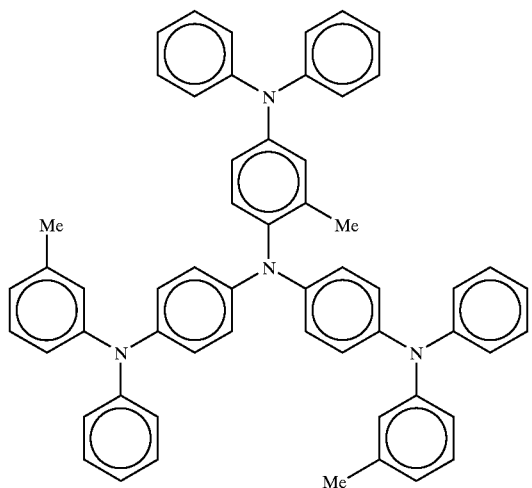

(83)

In the above formulae, Me represents a methyl group; Et represents an ethyl group; Bu represents a butyl group; and t-Bu represents a tert-butyl group. The light emitting layer 4 may contain materials other than those shown in the foregoing chemical formulae. Also, the light emitting layer may be doped with a coumarin derivative having a high fluorescence quantum efficiency, a fluorescent material such as quinacridone derivatives.

In this embodiment, the hole injecting layer and the hole transport layer disposed between the anode and the light emitting layer may be formed as a mixed layer by coevaporating a plurality of materials made of organic compounds having the hole transport capability, and one or more of such mixed layers may be provided. In this way, one or more layers containing a material including an organic compound having the hole transport capability may be disposed between the anode and the light emitting layer as a hole injecting layer or a hole transport layer.

Several organic EL elements were specifically made for evaluating their characteristics.

EXAMPLE

The respective thin films were laminated on a glass substrate formed with an anode made of ITO having a thickness of 110 nm by a vacuum deposition method at the degree of vacuum of $5.0 \times 10^{-6}$ Torr.

First, 4,4'-bis[N-(1-naphthyl)-N-phenylamino]-biphenyl (hereinafter referred to as "NPB") represented by Chemical Formula (82) was formed in a thickness of 30 nm on the ITO anode as a hole injecting layer at the deposition rate of 3 Å/sec.

Next, 4,4'-N, N'-dicarbasol-biphenyl (hereinafter abbreviated as "CBP") represented by (Chemical Formula 59) and tris(2-phenylpyridine) iridium (hereinafter abbreviated as "Ir(PPY)3") represented by (Chemical Formula 40) were coevaporated from different evaporation sources in a thickness of 20 nm on the hole injecting layer as a light emitting layer. In this event, the concentration of Ir(PPY)3 in the light emitting layer was 6.5 wt %. The CBP was deposited at the deposition rate of 5 Å/sec.

Further, on the light emitting layer, (1,1'-bisphenyl)-4-olate)bis(2-methyl-8-quinolinolate-N1,O8) aluminum (hereinafter abbreviated as "BAlq3") represented by (Chemical Formula 10) was evaporated as a hole blocking layer in a thickness of 10 nm.

Subsequently, on the hole blocking layer, tris(8-hyroxyquinoline aluminum) (hereinafter abbreviated as "Alq3") represented by (Chemical Formula 41) was deposited as an electron transport layer in a thickness of 40 nm at the deposition rate of 3 Å/sec.

Further, on the electron transport layer, lithium oxide ($Li_2O$) was deposited as an electron injecting layer in a thickness of 5 Å at the deposition rate of 0.1 Å/sec, and aluminum (Al) was laminated on the electron injecting layer as an electrode in a thickness of 100 nm at the rate of 10 Å/sec to complete an organic light emitting element.

Figure 6:
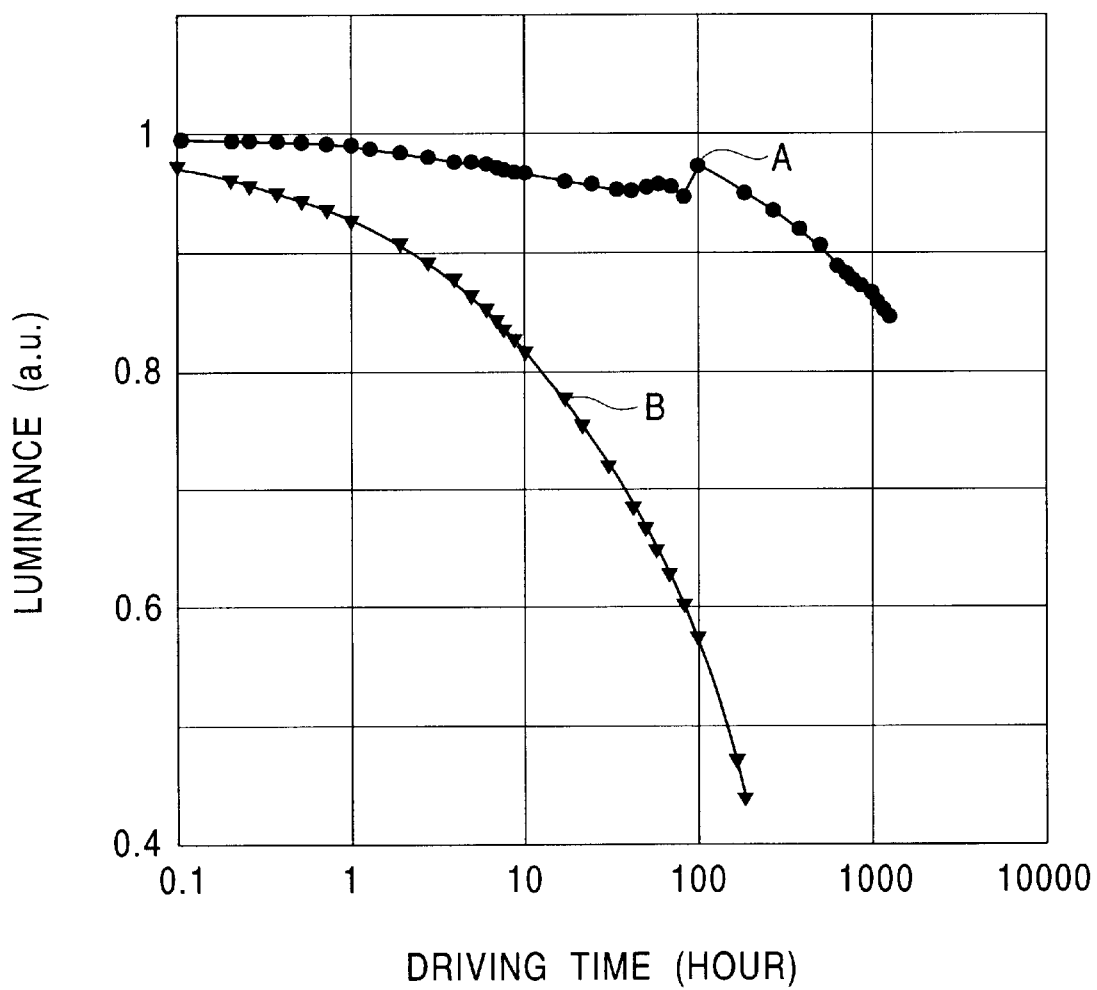
FIG. 6 is a graph showing a luminance property (curve A) vs. passage of driving time of the EL element of the embodiment according to the present invention.

This element emitted light from the light emitting layer of Ir(PPY)3. When the element fabricated as described above was driven with a regulated current of 1.2 $mA/cm^2$, the initial luminance was Lo=280 $cd/m^2$L. FIG. 6 shows a luminance property (curve A) vs. passage of driving time of the EL element of the embodiment on condition of the regulated current of 1.2 $mA/cm^2$.

Comparative Example 1

A comparative example was prepared in a similar manner to the Example except that the hole blocking layer was deposited in a thickness of 10 nm using 2,9-dimethyl-4,7-diphenyl-1,10-phenanthroline, instead of BAlq3.

The comparative element was driven and measured at the same condition as the Example. Curve B in FIG. 6 shows the comparative element's luminance property (Lo=500 $cd/m^2$).

As seen from FIG. 6, passage of time on condition o, the half-life of the embodiment was remarkably improved in comparison with the comparative element.

As described above, the present invention provides an organic EL element which can be driven to emit light for a long time by virtue of the hole blocking layer being is made of the aluminium chelate complex denoted by the formula (1) above mentioned, making it possible to prevent mutual diffusion of the hole blocking layer and adjacent layers due to heat generated during the driving of the organic EL element.

What is claimed is:
1. An organic electroluminescence element comprising: an anode, a light emitting layer made of an organic compound and a phosphorescent material, an electron transport layer made of an organic compound, and a cathode, which are layered in order, further comprising a hole blocking layer laminated between the light emitting layer and the electron transport layer and made of an aluminum chelate complex represented by a general formula (1)

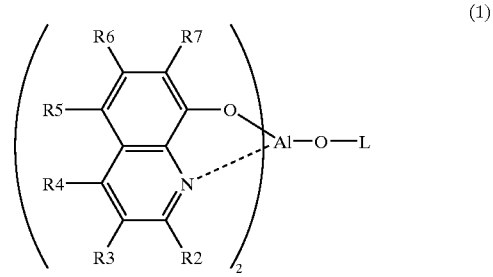

wherein
R2 denotes an alkyl, alkoxy, amino or hydrocarbon substituent, with each hydrocarbon moiety containing from 1 to 10 carbon atoms,
R3 to R7 independently denote a hydrogen atom, alkyl, alkoxy, amino or hydrocarbon substituent, with each hydrocarbon moiety containing from 1 to 10 carbon atoms, with the proviso that R5, R6 and R7 may also be selected from the group consisting of cyano, halogen, α-haloalkyl, α-haloalkoxy, amido, sulfonyl, carbonyl, carbonyloxy and oxycarbonyl substituents, with each hydrocarbon moiety containing from 1 to 10 carbon atoms,
L denotes one of formulae (2)

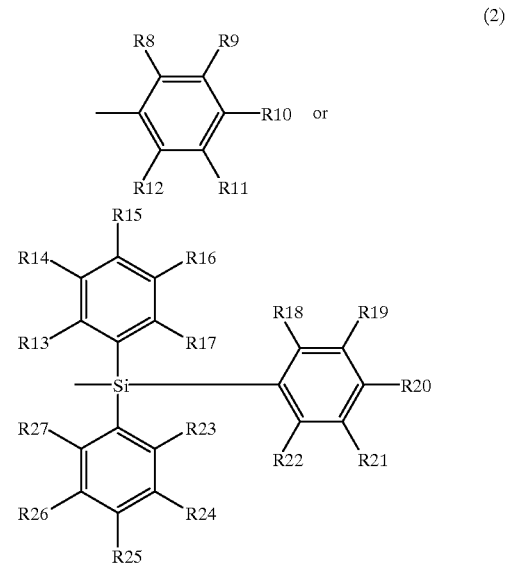

wherein
R8 to R12 independently represent hydrogen or hydrocarbon groups of from 1 to 12 carbon atoms, with the proviso that R8 and R9 together or R9 and R10 together can form a fused benzo ring,
R13 to R27 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25 can form a fused benzo ring.

2. An organic electroluminescence element according to claim 1, further comprising one or more layers made of a material having a hole transport capability, disposed between said anode and said light emitting layer, said material including an organic compound.

3. An organic electroluminescence element according to claim 1, further comprising one or more mixed layers made of plural organic materials having a hole transport capability, disposed between said anode and said light emitting layer.

4. An organic electroluminescence element according to claim 1, further comprising an electron injecting layer disposed between said cathode and said electron transport layer.

5. An organic electroluminescence element according to claim 1, wherein said light emitting layer includes an electron transport material having a smaller ionization potential than that of said hole blocking layer.

* * * * *